United States Patent
Cunningham et al.

(10) Patent No.: US 6,368,918 B2
(45) Date of Patent: Apr. 9, 2002

(54) METHOD OF FABRICATING NAN EMBEDDED FLASH EEPROM WITH A TUNNEL OXIDE GROWN ON A TEXTURED SUBSTRATE

(75) Inventors: James A. Cunningham, Saratoga; Richard A. Blanchard, Los Altos, both of CA (US)

(73) Assignee: Philips Semiconductors, New York, NY (US)

( * ) Notice: Subject to any disclaimer, the term of this patent is extended or adjusted under 35 U.S.C. 154(b) by 0 days.

(21) Appl. No.: 09/864,615

(22) Filed: May 23, 2001

Related U.S. Application Data

(62) Division of application No. 09/322,172, filed on May 28, 1999, now Pat. No. 6,272,050.

(51) Int. Cl.[7] .............................................. H01L 21/336
(52) U.S. Cl. ........................ 438/260; 438/257; 438/964
(58) Field of Search ................................. 438/260, 964

(56) References Cited

U.S. PATENT DOCUMENTS

| | | | |
|---|---|---|---|
| 5,429,966 A | * | 7/1995 | Wu et al. .................... 438/594 |
| 5,445,982 A | * | 8/1995 | Hwang ........................ 438/594 |
| 6,043,124 A | * | 3/2000 | Wu .............................. 438/260 |
| 6,184,087 B1 | * | 2/2001 | Wu .............................. 438/260 |
| 6,204,124 B1 | * | 3/2001 | Wu .............................. 438/264 |
| 6,207,505 B1 | * | 3/2001 | Wu .............................. 438/264 |

* cited by examiner

*Primary Examiner*—Michael S. Lebentritt
*Assistant Examiner*—Beth Elise Owens
(74) *Attorney, Agent, or Firm*—Peter Zawilski

(57) ABSTRACT

Exemplary embodiments are directed to providing a flash EEPROM technology which is compatible with deep sub-micron dimensions, and which is suitable for straightforward integration with high performance logic technologies. Unlike known technologies, exemplary embodiments provide a reduced cell area size in a split gate cell structure. An exemplary process for implementing a flash EEPROM in accordance with the present invention involves growing a tunneling oxide in a manner which reduces tunneling barrier height, and requires minimum perturabition to conventional high performance logic technologies, without compromising logic function performance.

7 Claims, 5 Drawing Sheets

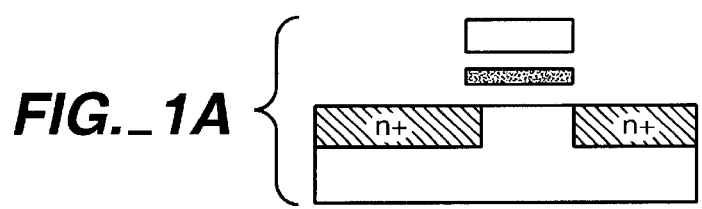
FIG._1A
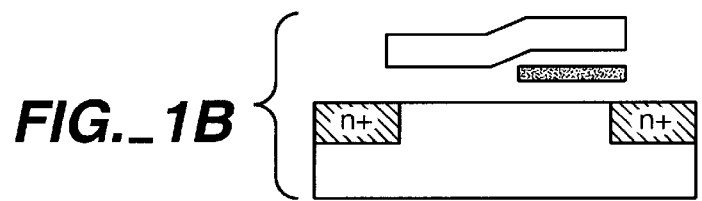
FIG._1B
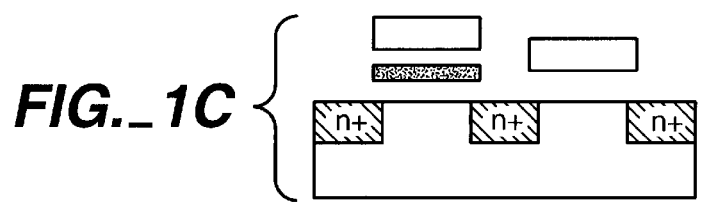
FIG._1C
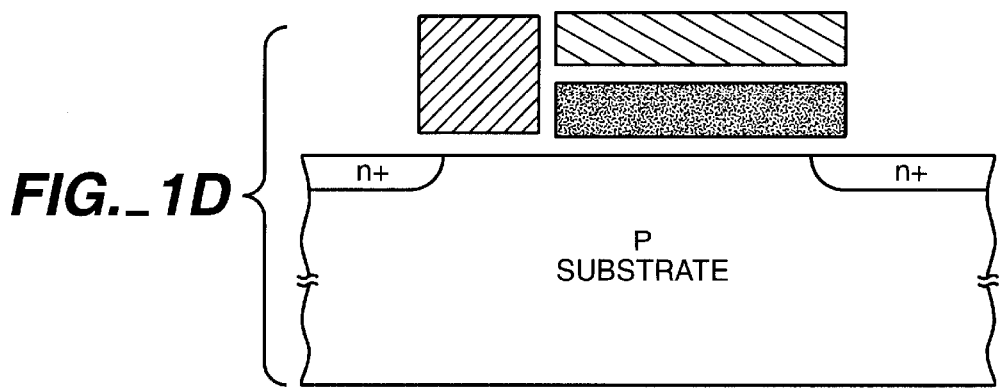
FIG._1D
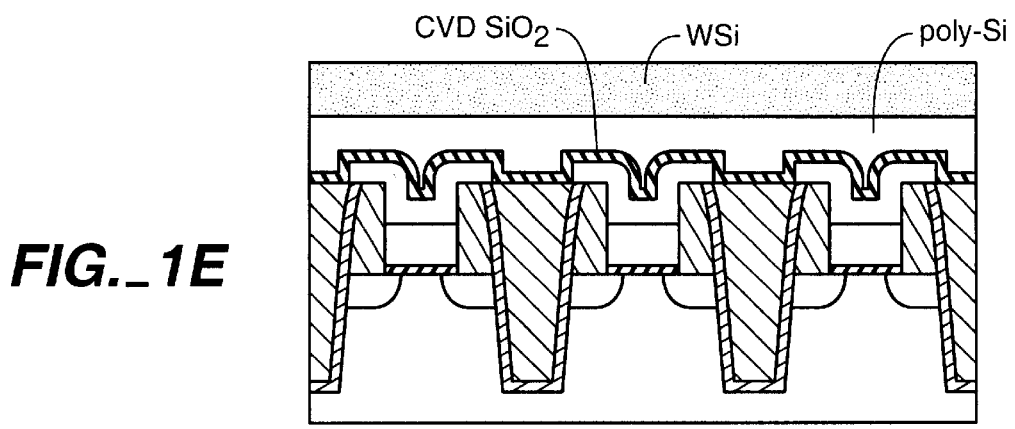
FIG._1E

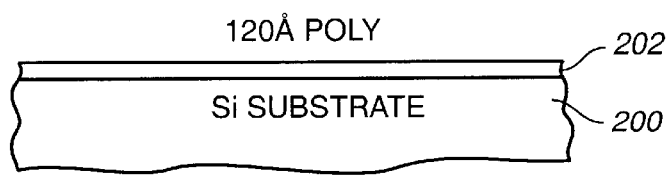
FIG._2A
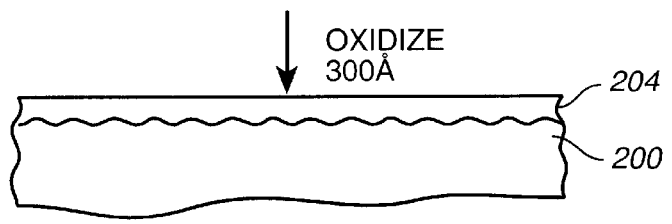
FIG._2B
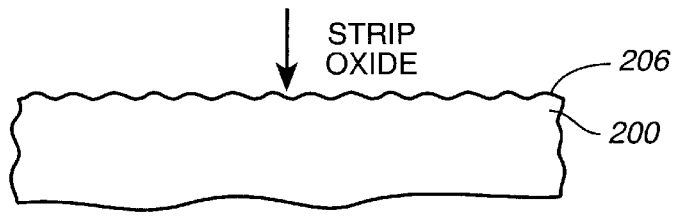
FIG._2C
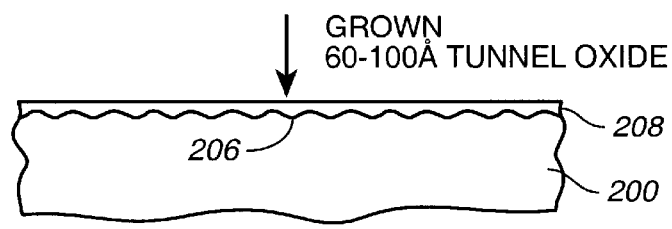
FIG._2D
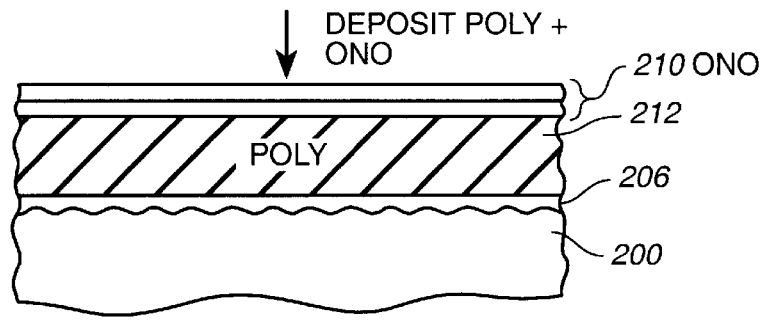
FIG._2E

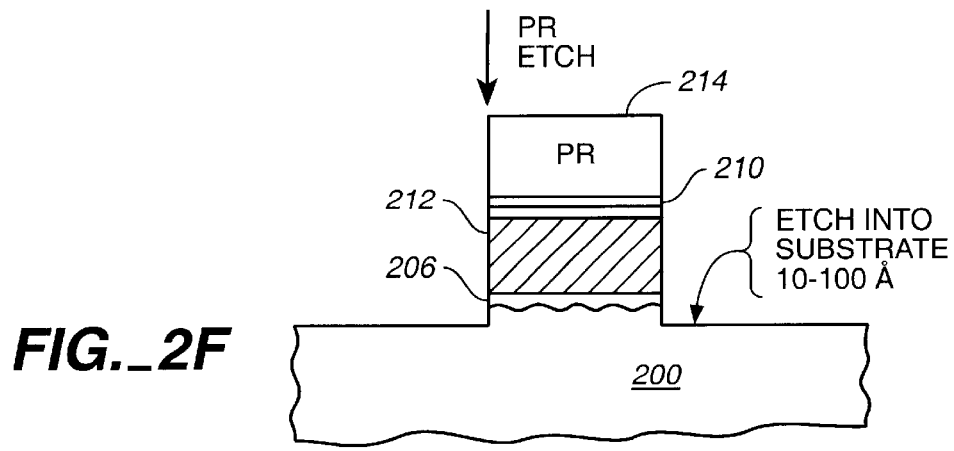
FIG._2F
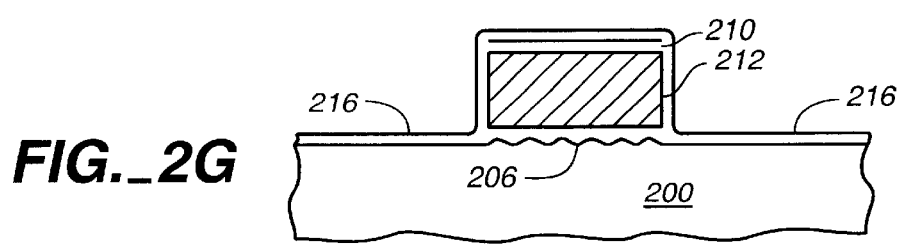
FIG._2G
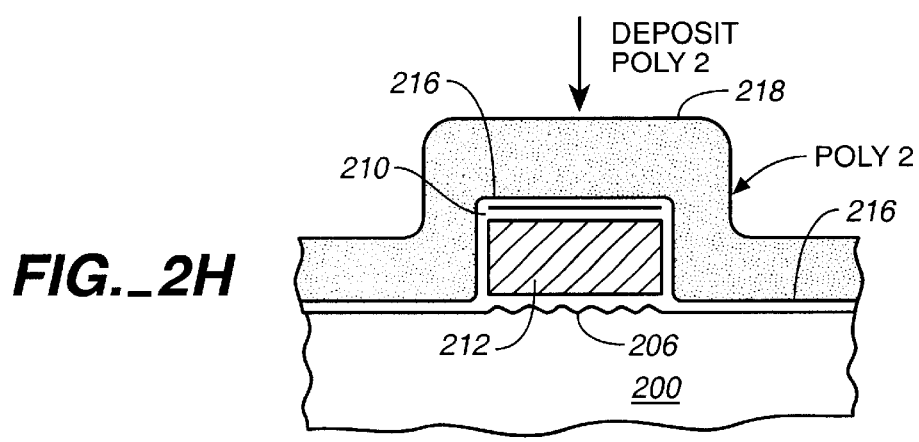
FIG._2H
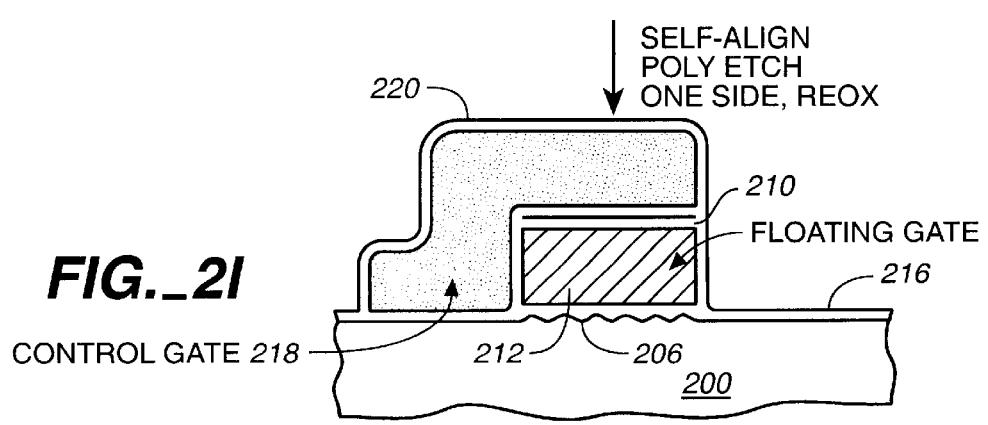
FIG._2I

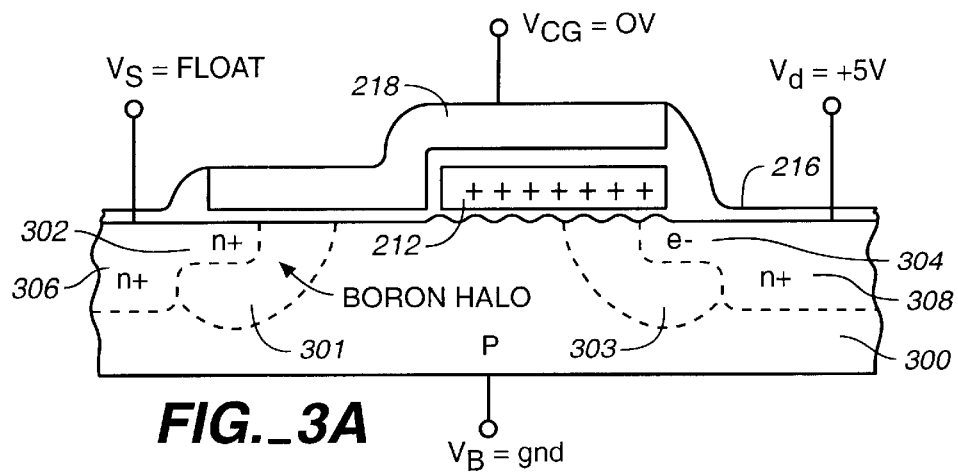
FIG._3A
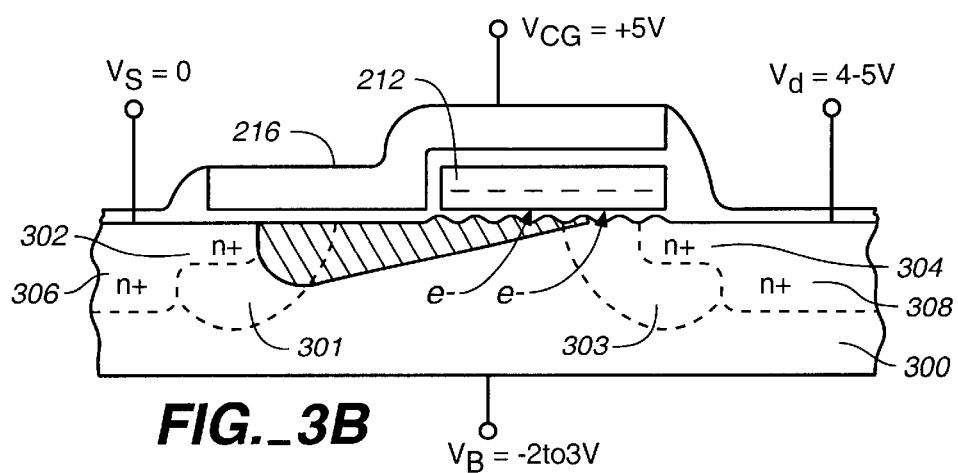
FIG._3B
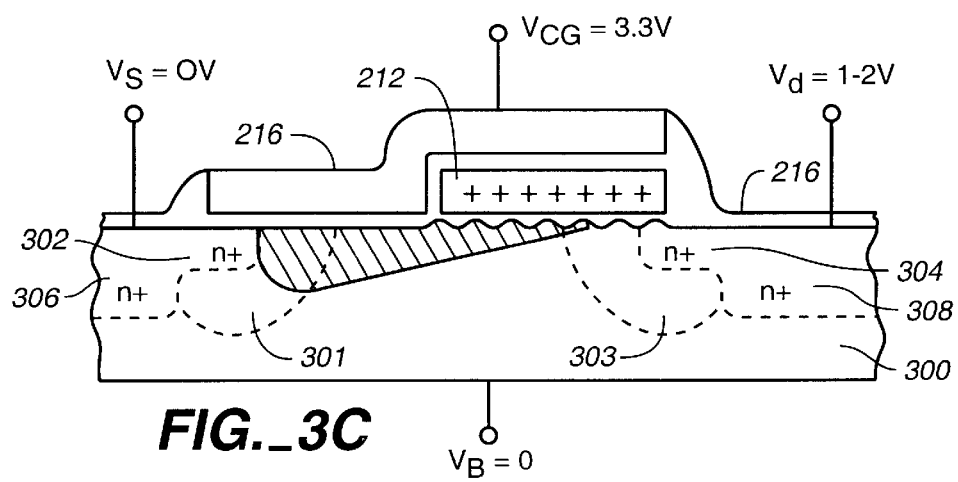
FIG._3C

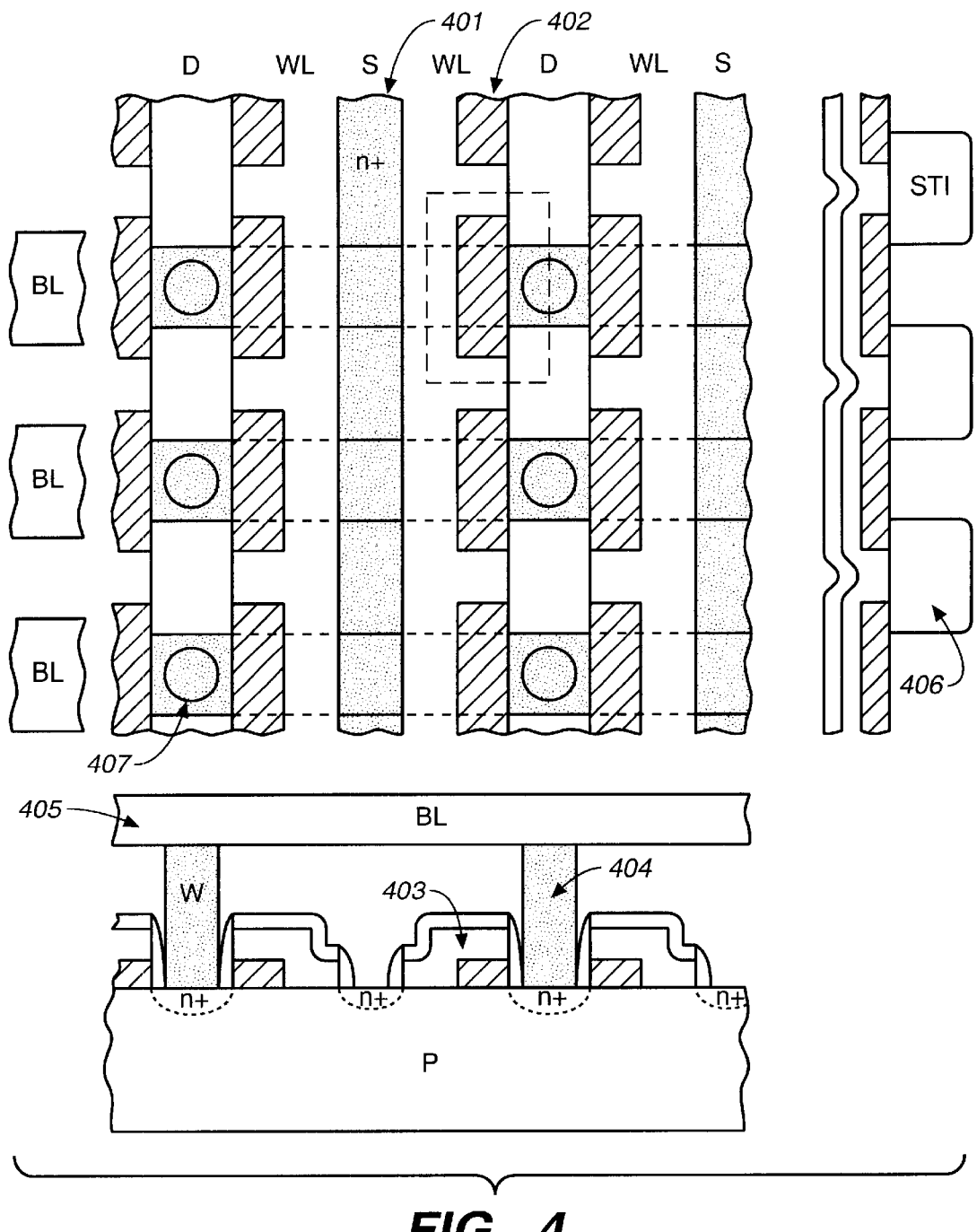
FIG._4

METHOD OF FABRICATING NAN EMBEDDED FLASH EEPROM WITH A TUNNEL OXIDE GROWN ON A TEXTURED SUBSTRATE

RELATED APPLICATIONS

This application is a divisional of application No. 09/322,172, filed on May 28, 1999, now U.S. Pat No. 6,272,050.

The present application relates to a co-pending application filed concurrently herewith, entitled: METHOD AND APPARATUS FOR PRODUCING A SINGLE POLYSILICON FLASH EEPROM HAVING A SELECT TRANSISTOR AND A FLOATING GATE TRANSISTOR, now U.S. Pat. No. 6,177,703, the disclosure of which is hereby incorporated by reference in its entirety.

BACKGROUND OF THE INVENTION

1. Field of the Invention

The present invention is generally directed to semiconductor memories, and more particularly, to the development of memory cells which can be easily integrated with high performance logic technologies.

2. State of the Art

Those skilled in the art appreciate the desirability of embedding memory technology such as dynamic random access memories (DRAMs), static random access memories (SRAMs), read-only memories (ROMs), electrically erasable programmable read-only memories (EEPROMs), and flash EEPROMs into high performance logic technologies. However, at present, only technologies such as SRAM and ROM are straightforward to integrate into high performance logic technologies. Technologies, such as EEPROM and DRAM technologies are highly dedicated to their specific needs, and are very complex, rendering them unsuitable for straightforward, easy integration into high performance logic technologies.

For example, EEPROM technology is typically implemented using one of four basic cell types: (1) the one transistor stacked-gate flash EEPROM cell; (2) the one and one half transistor split-gate flash EEPROM cell; (3) the double-gate two transistor EEPROM cell; and (4) cells which use edges for control or select gates. There have also been proposals regarding flash memory cells which form self-aligned trenches at the edge of a partially formed stack-gate structure. However, each of these technologies suffers drawbacks which inhibits their straightforward, easy integration into high performance logic technologies.

FIG. 1A shows a typical one transistor stacked-gate flash EEPROM cell. Stacked-gate flash EEPROM cells are available from Intel Corp. and Advanced Micro Devices Corp. (e.g., the Intel E28F016SA 16 Mbit flash memory and the AMD AM29F016 16 Mbit flash memory), having basic cell sizes of approximately 6 and 7 times the minimum feature size (f) squared (i.e., $f^2$), respectively. However, these cells possess a very complex source-drain region which requires as many as four ion implants. These submicron cells are subject to punch through, premature breakdown at the drain, and various read disturb problems. In addition, the cells are susceptible to over erase, which can lead to a permanently turned-on device. These cells are also difficult to scale downward, because high voltages are required for the erase and program functions. Erasure is performed by taking an extended source diffused region to a high positive value to pull electrons from the floating gate by Fowler-Nordheim (FN) tunneling to make the floating gate more positive. The erase function is performed by lowering the floating gate threshold voltage $V_T$, while programming is accomplished by applying high voltage to the drain and to the control gate formed with a second polysilicon layer (i.e., poly 2) to inject hot electrons from a channel near the drain onto the floating gate to raise the threshold voltage. That is, programming is achieved using hot electron injection by applying high voltage to the control gate. The high voltage (e.g., approximately 12 volts) requires inclusion of separate high voltage transistors.

The exemplary FIG. 1 cell involves using two levels of polysilicon. Typical products use a NOR configuration, where each cell is configured with a bit line (BL) connection to the drain, a poly 2 control line (CL) or word line (WL), and a diffused source line (SL). The high voltages required for this device require building separate high voltage transistors which may have longer distances between the source of drain diffusion (i.e., longer $L_{eff}$) and thicker gate oxides, thereby adding to the overall size of a memory device implemented with these cells.

A one and one-half transistor split-gate flash EEPROM, as shown in FIG. 1B, avoids the over erase problem described with respect to the stacked-gate flash EEPROM cell, but is a larger cell size than the stacked gate. For a split-gate cell using modern shallow trench isolation (STI), an n+ source line self-aligned to the poly, self-aligned tungsten plug contacts, and conservative poly 1 to poly 2 aligment tolerances, a typical cell area can be on the order of approximately 10 $f^2$. Lower n+ source regions may be created in the substrate by etching the oxide in an STI region down to the substrate. The poly 2 layer and a resist mask are used to protect other shallow trench isolation (STI) regions during etching.

A double-gate two transistor EEPROM cell is shown in FIG. 1C, and includes a separate select transistor to permit erasure of individual cells. Such a cell is, for example, available from Atmel in its AT17C128 128 k serial EEPROM, which has a cell area of approximately 17 $f^2$ for 1.0 micron rules. The cell is relatively large and is not used in flash EEPROMs.

FIG. 1D illustrates an exemplary cell which uses polysilicon edges for control of select gates. For example, exemplary versions of this cell use closely spaced polysilicon edges for voltage coupling. Although the cells are smaller than the cells discussed previously, they are very complex as reflected, for example, in the Sandisk 35 bit triple-polysilicon flash EEPROM, which is approximately 5 $f^2$ in cell area using 0.6 micron rules. Because of their complexity, they are unsuited to integration in high performance logic technology.

FIG. 1E shows an exemplary flash memory cell described in a document entitled "A 0.24 $\mu m$ 2 Well Process with 0.18 $\mu m$ Width Isolation and 3-D Interpoly Dielectric Films for 1-Gb Flash Memories", by Takashi Kobayashi et al, 1997 IEDM, page 275. Again, the process of producing such a cell is complex, and impractical for integration into high performance logic technology.

Because numerous applications exist for integrating flash EEPROM technology with high performance complementary metal oxide semiconductor (CMOS) logic devices (e.g., microprocessors), the development of such a technology would be highly desirable. For example, the applications for such an integrated technology include software updates, storing identification codes, system reconfiguration in the field, look-up tables, manufacturing codes, non-volatile data storage, smart cards which use flash embedded memory, prototyping, and various programmable logic devices and field programmable gate arrays.

Known process technologies do not lend themselves to easy integration of commodity flash EEPROM cells with logic devices, such as high performance CMOS devices. That is, known processes, including processes as described in a document entitled "EEPROM/Flash Sub 3.0V Drain-Source Bias Hot Carrier Rating", by J. D. Bude et al., 1995 IEDM, page 989 and in a document entitled "Secondary Electron Flash-A High Performance Low Power Flash Technology for 0.25 μm and Below", by J. D. Bude et al., 1997, IEDM page 279, do not sufficiently simplify the flash EEPROM cell and fabrication process to permit straightforward integration into conventional high performance logic processes. In these documents, structural properties of submicron stacked gate EEPROM devices are disclosed which yield devices that can be programmed at low voltages. The properties are: (1) thin tunneling oxides (e.g., in a range of approximately 60 angstroms (Å)-100 Å); (2) heavily-doped shallow n+ junctions with boron halo implants, giving abrupt junctions; and (3) a negative substrate bias.

In addition to process compatibility problems, scaling EEPROM technology into the 0.25 μm regime and below, as is used on typical high performance logic processes, has not been realized. Those skilled in the art have suggested that scaling EEPROM devices is subject to physical limits which may inhibit a reduction in cell size (see, for example, "Nonvolatile Semiconductor Memory Technology", by William D. Brown and Joe E. Brewer, IEEE, Press 1998, page 130). Given the wide applicability of flash EEPROM technology, it would be desirable to avoid the process compatibility problems associated with integrating typical cell designs with conventional logic devices by developing a cell which can be easily integrated into high performance logic processes.

SUMMARY OF THE INVENTION

Accordingly, exemplary embodiments are directed to providing a flash EEPROM technology which is compatible with deep submicron dimensions, and which is suitable for straightforward integration with high performance logic technologies. Unlike known technologies, exemplary embodiments provide a reduced cell area size in a split-gate cell structure. An exemplary process for implementing a flash EEPROM in accordance with the present invention involves growing a tunneling oxide in a manner which reduces tunneling barrier height, and requires minimum perturabition to conventional high performance logic technologies, without compromising logic function performance.

Generally speaking, exemplary embodiments are directed to a split-gate flash memory cell comprising: a tunneling oxide formed by oxidation of a textured monocrystalline substrate; a floating gate electrode formed over said tunneling oxide; a gate oxide, separate from the tunneling oxide, formed on a non-textured portion of said monocrystalline substrate; and a control gate electrode formed over said floating gate electrode and said gate oxide. An exemplary flash-EEPROM cell implemented in accordance with exemplary embodiments of the present invention is straightforward to integrate into high performance logic processes. In addition, the cell is free from the over-erase problem of one transistor stacked-gate flash EEPROM cells, and can more easily be scaled downward. In addition, the cell can be programmed and erased at lower voltages, thereby eliminating process complexity associated with accommodating high on-chip voltages.

BRIEF DESCRIPTION OF THE DRAWINGS

The foregoing and other objects and features of the present invention will become more apparent from the following detailed description of preferred embodiments when read in connection with the accompanying drawings, wherein:

FIGS. 1A–1E illustrate exemplary conventional EEPROM cells;

FIGS. 2A–2I illustrate an exemplary process flow for implementing a flash EEPROM cell in accordance with the present invention;

FIGS. 3A–3C illustrate exemplary erase, program and read functions of a flash EEPROM cell in accordance with the present invention; and FIG. 4 illustrates an exemplary cell layout in accordance with the present invention.

DETAILED DESCRIPTION OF THE PREFERRED EMBODIMENTS

FIGS. 2A–2I, illustrate an exemplary process flow for producing a self-aligned, textured-substrate tunneling-oxide under a floating gate, and a standard oxide-nitride-oxide (ONO) dielectric layer over the floating gate for a high coupling ratio in accordance with exemplary embodiments of the present invention. In FIG. 2A, a first polysilicon layer 202 is deposited on a single crystal (i.e., monocrystalline) silicon substrate 200. In an exemplary embodiment, the first polysilicon layer (i.e., poly 1 layer) is approximately 120 Å in thickness, or any thickness on the order of 120 Å.

In FIG. 2B, the first polysilicon layer is oxidized into the substrate to form an oxidation layer 204 of, for example, approximately 300 Å, or any thickness suitable for forming an acceptable textured surface as shown in FIG. 2C. FIG. 2C illustrates a stripping of the oxidation layer 204, resulting in the formation of a textured (i.e., rough) surface 206 on the single crystal silicon substrate 200. In FIG. 2D, a tunnel oxide layer 208 is grown on the textured surface 206. In exemplary embodiments, the tunnel oxide layer is grown with a depth of, for example, approximately 60 to 100 Å, and will ultimately have the floating gate formed over it.

FIG. 2E illustrates the deposition and formation of an oxide-nitride-oxide (ONO) dielectric layer 210 after first depositing a new first polysilicon layer 212 (poly 1 layer). The ONO layer 210 is deposited in known fashion, and can, for example, have a thickness of approximately 100–150 Å. The ONO layer 210 will constitute an interpoly dielectric formed between the poly 1 layer 212 and a later formed poly 2 layer.

In FIG. 2F, a photoresist layer is deposited on the interpoly ONO layer 210 and is used to form a photoresist mask 214. The photoresist mask 214 is used to perform a photoresist etch into the substrate (e.g., to a depth on the order of approximately 10–100 Å into the substrate). The etch into the substrate is sufficient to remove unmasked portions of the textured surface 206. The textured surface is removed in portions of the substrate to permit a regular gate oxide to be grown thereon. As such, a self-aligning process is used to ensure that the textured surface 206 is retained only beneath the remaining portions of the poly 1 layer 212.

In FIG. 2G, the photoresist mask 214 has been removed and a gate oxide has been grown on exposed surfaces of the substrate and poly 1. A sacrificial oxide may be formed and stripped prior to gate oxide formation as is known in the art. FIG. 2G illustrates a regrowth of a gate oxide 216 with a thickness of, for example, approximately 100 Å. In FIG. 2H, a second polysilicon layer 218 (i.e., poly 2 layer) has been deposited over the FIG. 2G structure.

FIG. 2I shows the formation of a control gate from the poly 2 layer 218 with a stepped configuration relative to the remaining portion of the poly 1 layer 212 that constitutes the floating gate of the cell structure. The control gate is formed by etching the poly 2 layer 212 using a technique similar to that described above with respect to the etching of the poly 1 layer to form the floating gate. The right hand edges of the floating gate and the control gate (as viewed in FIG. 2I) can be aligned using a self-aligned etching procedure (i.e., whereby the edges of the poly 2 and poly 1 layers are etched together). Afterwards, a reoxidation process can be used to grow an oxide layer 220 over the exposed surfaces of the control gate and floating gate. Those skilled in the art will appreciate that a relatively tall gate edge on a source side of the cell (i.e., shown to the left in FIG. 2I) facilitates the use of a self-aligned contact there, because the thickness of the edge spacer will increase.

Referring to FIG. 3, a flash EEPROM cell configured using a process such as that described with respect to FIG. 2 can take into account the various conditions described by Bude regarding structural properties of submicron gate EEPROM devices; i.e., use of thin tunneling oxides, heavily doped shallow n+ junctions with boron halo implants, and negative substrate bias. The substrate bias can be facilitated by using a triple well process, such as a p-well in a deep n-well on a p-substrate. As such, conventional n-well on p-type material can be used for construction of the logic circuits. The bias on the p-well, where the flash cells are constructed, can be applied using on-chip voltage generation circuits, or the voltage can be supplied externally. As such, a device produced using the FIG. 2 process can include erase, program and read functions that are implemented in a manner as illustrated with respect to FIGS. 3A–3C respectively.

Referring to FIGS. 3A–3C, relatively low programming voltages can be used in conjunction with the device produced using the FIG. 2 process. In FIGS. 3A–3C, the flash EEPROM cell is a 3.3 volt design, and all voltages used for the erase, program and read functions can be generated on-chip without high voltage transistors.

More particularly, referring to FIG. 3A, an erase function is illustrated for a flash EEPROM cell produced using the process described with respect to FIG. 2. Boron halo implants 301 and 303 are formed in source and drain regions, respectively. FIG. 3A illustrates heavily-doped shallow n+ junctions 302 and 304 in a p-well of substrate 300 for the source and drain portions of the cell. These regions are formed in similar fashion to the well known LDD process but with a higher dose implant. Somewhat deeper, more conductive, heavily doped regions 306 and 308 are also formed as part of the source and drain regions.

The source drain regions can be formed together with use of a triple well process. The substrate can be negatively biased, with the p-type well being formed in a deep n-well on a p-type substrate, thereby constituting the triple well process which facilitates substrate biasing. A voltage supply contact $V_S$ for the source, $V_d$ for the drain, $V_{CG}$ for the control gate, and $V_B$ for the substrate biasing are also provided.

The erase function is implemented by floating $V_S$, placing $V_{CG}$ at ground, supplying a voltage pulse of, for example, 5 volts to the drain (i.e., $V_d$) and placing $V_B$ at ground. The threshold voltage $V_T$ at the floating gate drops below approximately 1 volt. Thus, for an erase condition, $V_T$ is relatively low. For example, for a target $V_T$ of 0.5 volts, the floating gate potential is about 1.0 volts (electrons depleted), which is too low to cause significant linkage by the Fowler-Nordheim process. To erase the floating gate in a relatively short time, the electric field should be sufficiently high that the Fowler-Nordheim conduction is operative.

In exemplary embodiments, for 100 Å silicon dioxide dielectrics, 5 volt pulses on the drain produce currents on the order of $10^{-4}$ to $10^{-5}$ A/cm². (This assumes that for the n+ poly-n+ substrate structure which accomplishes the tunneling, the flat band voltage which reduces the electric field across the oxide is negligible). Because the threshold shift is given roughly by $Q/C_o$, where Q is the charge transfer to the floating gate and $C_0$ is the floating gate-to-substrate capacity per unit area, substituting Jt for Q where J is the current density and t is time and seconds, for a three volt shift, only about 0.01 seconds are required. The actual erase time can be on the order of 5 to 10 times longer because the drain extension area under the floating gate is less than the total floating gate area, in exemplary embodiments. Those skilled in the art will appreciate that a value of a 3 volt shift is by way of example only.

The n+ extensions shown in FIG. 3A can be formed prior to spacer formation using, for example, a phosphorus or arsenic implant of approximately $5 \times 10^{14}$ atoms/cm² and using a drive-in/activation step with RTA such that a junction depth is approximately 0.1 to 0.2 μm. This yields an exemplary doping concentration of mid $10^{19}$ atoms/cm³ range. Some diffusion underlap of the floating gate is used to accomplish the erase function.

Those skilled in the art will appreciate that the values used for the various voltages of the FIG. 3A erase function, as well as those discussed with respect to FIGS. 3B and 3C, can be modified as desired. For example, the erase function can be performed at lower $V_d$ values by, for example, using a thinner tunneling oxide.

FIG. 3B illustrates an exemplary program function wherein an increased threshold voltage on a floating gate electrode is caused by channel initiated secondary electrons. As mentioned above, a device configured and produced in accordance with exemplary embodiments of the present invention can be programmed using relatively low voltages. For a charge to be retained over a long period of time (e.g., many years) on the floating gate upon programming, given an exemplary $V_T$ of approximately 2 to 4 volts (measured at $V_B=0$), the electric field should be low enough that the Fowler-Nordheim conduction mechanism is non-operative. Silicon dioxide leakage current densities are, for example, on the order of $10^{-15}$ A/cm². This is achieved by forming dielectrics at an upper range of resistivities, by using dry $O_2$ oxidation recipes known to those skilled in the art.

Because the Fowler-Nordheim currents are much lower when leakage flows from negatively charged electrodes, the programmed $V_T$ is held by a negatively charged floating gate. The program state can be maintained a long period of time when the voltage-to-substrate electric field residing at the floating gate is small.

The threshold voltage at the floating gate $V_T$ of an n-channel transistor with a channel doping concentration of about $2 \times 10^{17}$ atoms/cm³, which is a value suitable for technologies in the 0.25 to 0.5 micron range is given by:

$$V_T = \Phi_{MS} - Q_F/C_0 + 2\Phi_F + [2\epsilon_s\epsilon_0 q N_A(2\Phi_F + V_{BG})]^{1/2}/C_0 + V_{FG} + \Sigma q/C_0$$

where $\Phi_{MS}$ is the metal-silicon work function, $Q_F$ is the fixed charge, $\Phi_F$ is the Fermi potential, Co is the capacitance, $\epsilon_s$ is the dielectric constant for silicon, $\epsilon_0$ is the permitivity of free space, $V_{BG}$ is the back gate, $V_{FG}$ is the voltage left on the field gate after programming, $\Sigma$ is the boron threshold-adjust implant dose, and q is the charge on the electron.

For the programmed state, the $V_T$ is sufficiently high that the transistor will not turn on. Substituting $V_T=3V$ (measured at $V_{BG}=0$), a low value for $Q_F$, $V_{BG}=0V$, using 100 Å for the gate oxide thickness, other exemplary values appropriate for $N_A=2\times10^{17}$ atoms/cm$^3$, and $\Sigma q=0$, the voltage on the $V_{FG}$ is about −0.5 V (electrons accumulated). This would yield a low electric field of $0.5\times10^6$V/cm where almost no tunneling currents would flow. Programming can be done with a back gate bias, but the target threshold voltage is without that bias because the read condition is also without the bias. This lowers the charge on the floating gate, which must be held over a long time. The $V_T$ target can be lower, of course, making the charge on the floating gate even lower. Various other conditions can be specified for scaled technologies, as will be apparent to those skilled in the art.

The relatively high doping concentration in the channel, near the surface can be the accumulation of several possible boron implants including the p-well, punch through and threshold adjust. Known halo implant processes can be used to produce the halo implants, and thereby improve punch through and other properties.

FIG. 3C shows exemplary voltages associated with a read function. Hot electron reliability problems are avoided by using a low $V_D$ during the read operation. Exemplary voltages are as follows: $V_S$ and $V_B$ are at 0 volts and $V_{CG}$ is approximately 3.3 volts, $V_D$ is approximately 1–2 volts. A low $V_T$ constitutes an on condition representing a "1" and a high $V_T$ constitutes an off condition constituting a "0" condition.

Exemplary embodiments of a flash EEPROM cell configured as discussed with respect to FIGS. 3A–3C and produced using a process as described with respect to FIG. 2 can be readily integrated into conventional high performance logic processes. For example, at the 0.25 micron level, it is common in conventional high performance logic technologies to first form shallow trench isolation regions using a silicon nitride layer that serves as a chemical mechanical polish (CMP) stop after filing with SiO$_2$. The wells can then be formed using high voltage ion implantation. The floating gates are then formed as disclosed in FIG. 2. The second polysilicon layer (i.e., poly 2) serves as gate electrodes for the logic transistors. The poly 2 layer can be formed as a polycide, or a salicide process can be used. Self aligned contacts can be formed using appropriate dielectric spacers as is known by those skilled in the art. The logic transistors can be formed as lightly doped drains (LDDS) with spacers. Extensions for the flash transistors can be doped at a higher level using appropriate masking an ion implantation steps. Thus, those skilled in the art will appreciate that a process for forming the FIG. 3 cell can be easily integrated with a high performance logic process.

FIG. 4 is an exemplary layout of a split gate, double poly structure suitable for the novel textured substrate EEPROM cell shown in FIGS. 2 and 3. The cell area is about 8 to 10 f$^2$ depending on alignment tolerances. Shown is n+ source line 401, floating gate 402, word line poly 2 403, self-aligned tungsten plug contacts 404, bit line 405, STI regions 406, and drain contact 407. Not shown are their dielectrics and details of the n+ doped regions, which will be apparent to those skilled in the art.

Those skilled in the art will appreciate that the embodiments and processes described above are by way of example only. For example, additional steps can be added to the process discussed with respect to FIG. 2 and or additional features and/or voltages can be used in conjunction with the device illustrated in FIGS. 3A–3C.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for producing a split-gate flash memory cell comprising the steps of:

forming a tunneling oxide by oxidation of a textured portion of a monocrystalline substrate;

forming a floating gate electrode over said tunneling oxide; forming a gate oxide, separate from the tunneling oxide, on a non-textured portion of said monocrystalline substrate; and forming a control gate electrode over said floating gate electrode and said gate oxide.

2. The method according to claim 1, comprising:

self-aligning said floating gate electrode with said tunneling oxide.

3. The method according to claim 1, comprising:

forming an oxide-nitride-oxide dielectric layer between said floating gate electrode and said control gate electrode.

4. The method according to claim 3, wherein said oxide-nitride-oxide dielectric layer has a thickness of approximately 100 to 150 Å.

5. The method according to claim 1, wherein said floating gate electrode has a thickness of approximately 120 Å.

6. The method according to claim 1, wherein said tunneling oxide has a thickness of approximately 600 to 100 Å.

7. The method according to claim 1, wherein said floating gate electrode and said control gate electrode are formed of polycrystalline silicon.

* * * * *